(12) United States Patent
Satou

(10) Patent No.: US 12,706,570 B2
(45) Date of Patent: Aug. 11, 2026

(54) DIFFERENTIAL DOHERTY AMPLIFIER CIRCUIT

(71) Applicant: Murata Manufacturing Co., Ltd., Kyoto (JP)

(72) Inventor: Hideyuki Satou, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 469 days.

(21) Appl. No.: 18/495,170

(22) Filed: Oct. 26, 2023

(65) Prior Publication Data

US 2024/0146251 A1 May 2, 2024

(30) Foreign Application Priority Data

Oct. 27, 2022 (JP) ................................ 2022-172080

(51) Int. Cl.
*H03F 1/02* (2006.01)
*H03F 3/24* (2006.01)

(52) U.S. Cl.
CPC .......... *H03F 1/0288* (2013.01); *H03F 3/245* (2013.01); *H03F 2200/06* (2013.01); *H03F 2200/09* (2013.01); *H03F 2200/451* (2013.01)

(58) Field of Classification Search
CPC .... H03F 1/0288; H03F 3/245; H03F 2200/06; H03F 2200/09; H03F 2200/451; H03F 3/195; H03F 3/45; H05K 1/144; H05K 1/165; H05K 1/182
USPC ............... 330/252–261, 295, 124 R, 84, 286
See application file for complete search history.

(56) References Cited

U.S. PATENT DOCUMENTS 12,176,859 B2 * 12/2024 Liu ......................... H03F 3/245
2023/0336126 A1 * 10/2023 Park .................... H03F 3/45475
2025/0253808 A1 * 8/2025 Ji ............................ H03F 1/305

FOREIGN PATENT DOCUMENTS

JP 2013-085179 A 5/2013

* cited by examiner

*Primary Examiner* — Hieu P Nguyen
(74) *Attorney, Agent, or Firm* — McDonald Hopkins LLC

(57) ABSTRACT

A differential Doherty amplifier circuit includes a first differential amplifier including a first carrier amplifier and a second carrier amplifier, a second differential amplifier including a first peak amplifier and a second peak amplifier, a first line connected to the first carrier amplifier and the first peak amplifier, and a second line connected to the second carrier amplifier and the second peak amplifier. The first differential amplifier and the second differential amplifier are formed on a die of a chip device parallel to an XY plane. The first line and the second line are each formed of a wiring line disposed in a substrate parallel to the XY plane. The chip device is flip-chip mounted on the substrate in a Z direction orthogonal to the XY plane.

10 Claims, 12 Drawing Sheets

DIFFERENTIAL DOHERTY AMPLIFIER CIRCUIT

CROSS REFERENCE TO RELATED APPLICATION

This application claims priority from Japanese Patent Application No. 2022-172080 filed on Oct. 27, 2022. The content of this application is incorporated herein by reference in its entirety.

BACKGROUND ART

The present disclosure relates to a differential Doherty amplifier circuit.

A Doherty amplifier circuit is known as a highly efficient power amplifier circuit. A typical Doherty amplifier circuit has a configuration in which a carrier amplifier and a peak amplifier are connected in parallel to each other. The carrier amplifier operates regardless of the power level of a radio frequency (RF) input signal. The peak amplifier is turned OFF when the power level of an RF input signal is low and is turned ON when the power level of the RF input signal is high. With this configuration, when the power level of an RF input signal is high, the carrier amplifier operates while maintaining saturation at a saturated output power level. Accordingly, the Doherty amplifier circuit has enhanced efficiency compared with an ordinary power amplifier circuit. For example, Japanese Unexamined Patent Application Publication No. 2013-85179 discloses a layout in such a Doherty amplifier circuit having a differential configuration, in which an amplifier, an input/output phase shifter, and an output matching transformer that constitute the Doherty amplifier circuit are disposed on a die in an on-chip manner.

BRIEF SUMMARY

In recent years, RF modules including a power amplifier circuit, a switch circuit, a control circuit, and so forth integrated together have been developed. In such an RF module, a plurality of functional devices, such as a wafer level chip size package (WL-CSP) and a surface mount device (SMD), are mounted on, for example, a low temperature co-fired ceramics (LTCC) substrate or a dielectric substrate.

When the above-described related art is applied to such an RF module, a configuration is assumed in which individual components of a Doherty amplifier circuit are disposed on a die of a heterojunction bipolar transistor (HBT) device formed using an HBT process, and the die of the HBT device is mounted on a substrate constituting the RF module. Such a configuration has an issue of decreasing the die size of the HBT device and the size of the RF module substrate.

The present disclosure implements a differential Doherty amplifier circuit in which a mounted device and an RF module have a decreased size.

A differential Doherty amplifier circuit according to an aspect of the present disclosure includes a first differential amplifier including a first carrier amplifier and a second carrier amplifier, a second differential amplifier including a first peak amplifier and a second peak amplifier, a first line having one end connected to an output of the first carrier amplifier and an other end connected to an output of the first peak amplifier, and a second line having one end connected to an output of the second carrier amplifier and an other end connected to an output of the second peak amplifier. At least the first differential amplifier and the second differential amplifier are formed on a die of a chip device parallel to an XY plane including an X direction and a Y direction orthogonal to the X direction. The first line and the second line are each formed of a wiring line disposed in a substrate parallel to the XY plane, the chip device being flip-chip mounted on the substrate in a Z direction orthogonal to the XY plane. The first line has a first portion overlapping a region in which the chip device is mounted as viewed in the Z direction and a second portion not overlapping the region in which the chip device is mounted as viewed in the Z direction, the first portion having a larger area than the second portion. The second line has a third portion overlapping the region in which the chip device is mounted as viewed in the Z direction and a fourth portion not overlapping the region in which the chip device is mounted as viewed in the Z direction, the third portion having a larger area than the fourth portion.

This configuration makes it possible to achieve both a decreased die size of the chip device and a decreased size of the substrate.

A differential Doherty amplifier circuit according to an aspect of the present disclosure includes a first differential amplifier including a first carrier amplifier and a second carrier amplifier, second differential amplifier including a first peak amplifier and a second peak amplifier, a first inductor having one end connected to an output of the first carrier amplifier and an other end connected to an output of the first peak amplifier, a second inductor having one end connected to an output of the second carrier amplifier and an other end connected to an output of the second peak amplifier, a first capacitor connected between differential outputs of the first differential amplifier, and a second capacitor connected between differential outputs of the second differential amplifier. At least the first differential amplifier and the second differential amplifier are formed on a die of a chip device parallel to an XY plane including an X direction and a Y direction orthogonal to the X direction. The first inductor and the second inductor are each formed of a wiring line disposed in a substrate parallel to the XY plane, the chip device being flip-chip mounted on the substrate in a Z direction orthogonal to the XY plane. The first capacitor and the second capacitor are formed on the die of the chip device. The first inductor has a first portion overlapping a region in which the chip device is mounted as viewed in the Z direction and a second portion not overlapping the region in which the chip device is mounted as viewed in the Z direction, the first portion having a larger area than the second portion. The second inductor has a third portion overlapping the region in which the chip device is mounted as viewed in the Z direction and a fourth portion not overlapping the region in which the chip device is mounted as viewed in the Z direction, the third portion having a larger area than the fourth portion.

This configuration makes it possible to achieve both a decreased die size of the chip device and a decreased size of the substrate.

According to the present disclosure, it is possible to implement a differential Doherty amplifier circuit in which a mounted device and an RF module have a decreased size.

BRIEF DESCRIPTION

Hereinafter, differential Doherty amplifier circuits according to embodiments will be described in detail with reference to the drawings. The embodiments do not limit the present disclosure. The individual embodiments are examples, and it is obvious that components illustrated in different embodiments can be partially replaced or combined. In a second embodiment and thereafter, a description of the same matters as those of a first embodiment will be omitted, and only different points will be described. In particular, similar functions and effects obtained from similar configurations will not be repeatedly described in each embodiment.

First Embodiment

Figure 1:
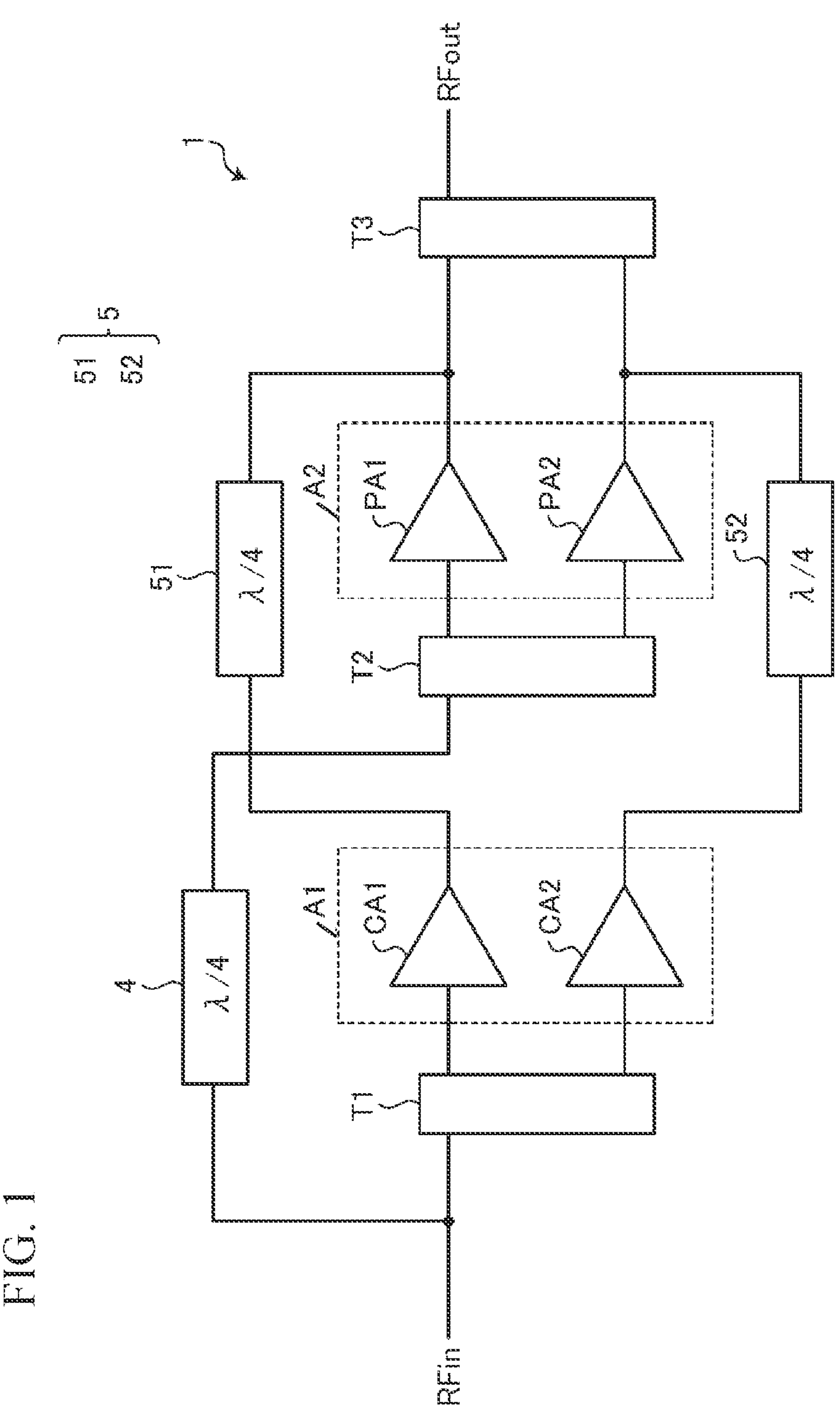
FIG. 1 is a diagram illustrating an example configuration of a differential Doherty amplifier circuit according to a first embodiment.

FIG. 1 is a diagram illustrating an example configuration of a differential Doherty amplifier circuit according to the first embodiment. A differential Doherty amplifier circuit 1 amplifies a radio frequency (RF) input signal RFin and outputs an RF output signal RFout.

The differential Doherty amplifier circuit 1 includes a first carrier amplifier CA1, a second carrier amplifier CA2, a first peak amplifier PA1, a second peak amplifier PA2, a first input balun transformer T1, a second input balun transformer T2, and an output balun transformer T3.

The first carrier amplifier CA1 and the second carrier amplifier CA2 constitute a first differential amplifier A1. In the present disclosure, the first carrier amplifier CA1 and the second carrier amplifier CA2 are each formed of a single-stage amplifier, but at least one of the first carrier amplifier CA1 and the second carrier amplifier CA2 may be formed of a multi-stage amplifier. The first input balun transformer T1 transforms the RF input signal RFin, which is an unbalanced input signal, into a differential signal, and inputs the differential signal to the first differential amplifier A1.

The first peak amplifier PA1 and the second peak amplifier PA2 constitute a second differential amplifier A2. In the present disclosure, the first peak amplifier PA1 and the second peak amplifier PA2 are each formed of a single-stage amplifier, but at least one of the first peak amplifier PA1 and the second peak amplifier PA2 may be formed of a multi-stage amplifier. The second input balun transformer T2 transforms an unbalanced input signal received via a phase circuit 4 into a differential signal, and inputs the differential signal to the second differential amplifier A2. The phase circuit 4 is a circuit that delays the phase of the RF input signal RFin by $\lambda/4$ and inputs the RF input signal RFin to the second input balun transformer T2. The phase circuit 4 is constituted by, for example, a transmission line, a 90-degree hybrid coupler, or the like.

A phase circuit 5 is disposed between the output of the first differential amplifier A1 and the output of the second differential amplifier. The phase circuit 5 is a circuit that delays the phase of the differential output of the first differential amplifier A1 by $\lambda/4$. A differential signal output from a connection point between the output of the second differential amplifier and the phase circuit 5 is transformed into RFout, which is an unbalanced output signal, by the output balun transformer T3.

In the differential Doherty amplifier circuit 1 illustrated in FIG. 1, the differential amplifier A1 (the first carrier amplifier CA1 and the second carrier amplifier CA2) operates regardless of the power level of the RF input signal RFin. The second differential amplifier A2 (the first peak amplifier PA1 and the second peak amplifier PA2) is turned OFF when the power level of the RF input signal RFin is low and is turned ON when the power level of the RF input signal RFin is high. The first differential amplifier A1 and the second differential amplifier A2 are connected in parallel to each other, and thereby the differential Doherty amplifier circuit 1 is constituted. With this configuration, when the power level of the RF input signal RFin is high, the first differential amplifier A1 (the first carrier amplifier CA1 and the second carrier amplifier CA2) operates while maintaining saturation at a saturated output power level. Accordingly, the differential Doherty amplifier circuit 1 has enhanced efficiency compared with an ordinary differential amplifier circuit.

Figure 2A:
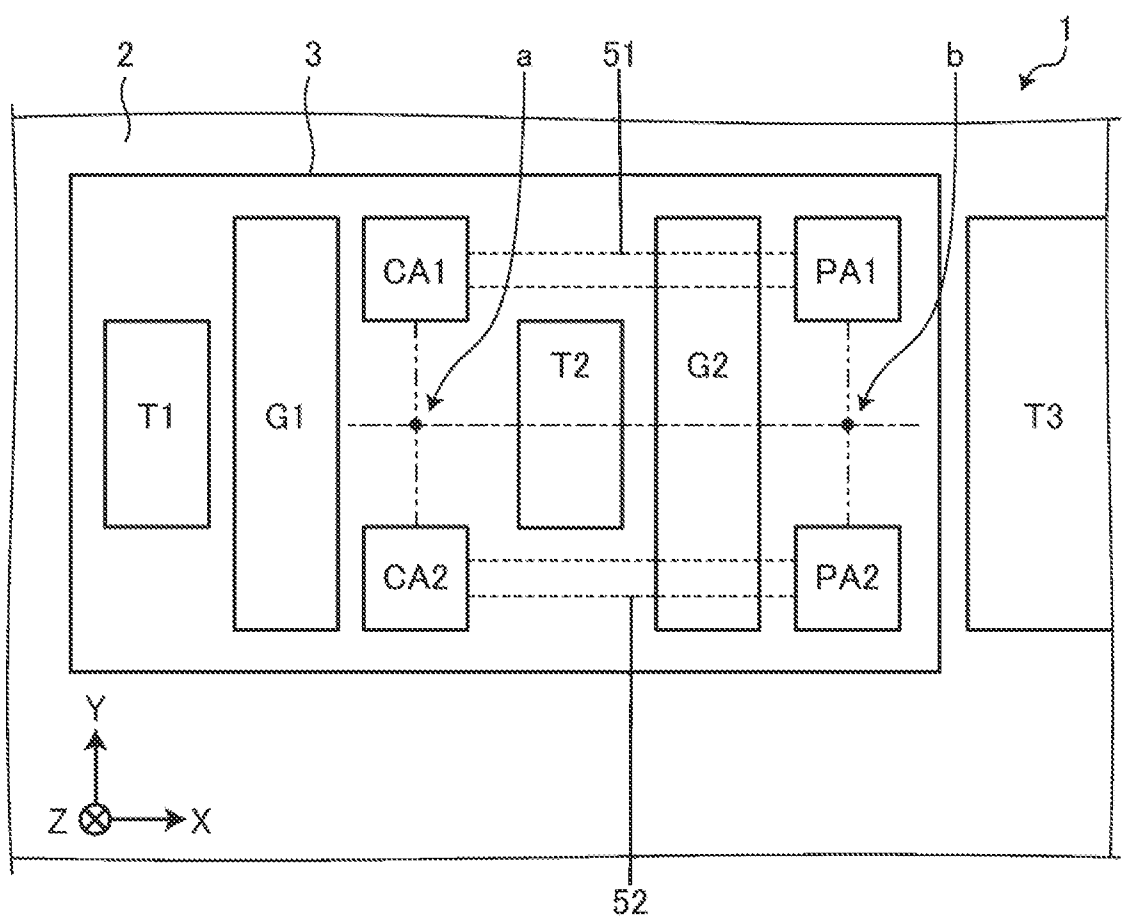
FIG. 2A is a plan view illustrating a conceptual mounting example of the differential Doherty amplifier circuit on a substrate according to the first embodiment.
Figure 2B:
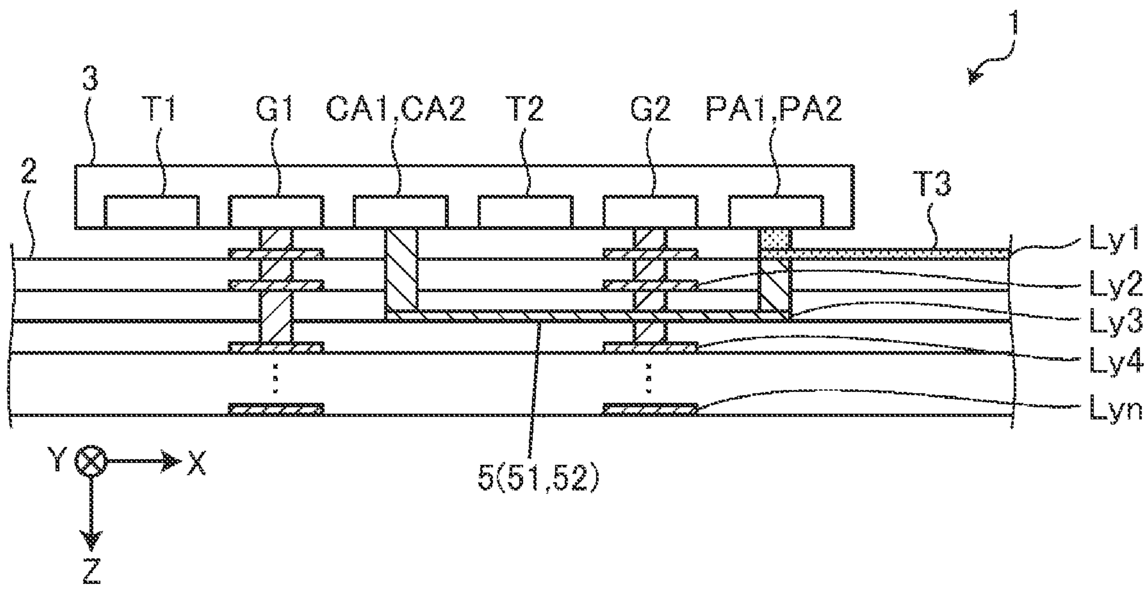
FIG. 2B is a side perspective view of the differential Doherty amplifier circuit illustrated in FIG. 2A as viewed in a Y direction.

FIG. 2A is a plan view illustrating a conceptual mounting example of the differential Doherty amplifier circuit on a substrate according to the first embodiment. FIG. 2B is a side perspective view of the differential Doherty amplifier circuit illustrated in FIG. 2A as viewed in a Y direction.

FIG. 2A and FIG. 2B illustrate an example of the differential Doherty amplifier circuit 1 mounted in a front end module. The front end module is an ultrasmall integrated module in which a plurality of integrated circuits and various functional components are integrally mounted on a substrate 2 parallel to an XY plane including an X direction and a Y direction orthogonal to the X direction illustrated in FIG. 2A and FIG. 2B in a Z direction orthogonal to the XY plane. The substrate 2 parallel to the XY plane includes a substrate substantially parallel to the XY plane, such as a substrate whose surface has some irregularities. The substrate 2 may be, for example, a ceramics laminated substrate such as a low temperature co-fired ceramics (LTCC) substrate, a resin multilayer substrate, or a film substrate.

A main circuit block of the differential Doherty amplifier circuit 1 illustrated in FIG. 2A and FIG. 2B is formed on a die of a chip device 3 that is flip-chip mounted on the substrate 2 in the Z direction and that is parallel to the XY plane. Specifically, FIG. 2A and FIG. 2B illustrate an example in which at least the first carrier amplifier CA1, the second carrier amplifier CA2, the first peak amplifier PA1, the second peak amplifier PA2, the first input balun transformer T1, and the second input balun transformer T2 are formed on the die of the chip device 3.

In the present disclosure, the output balun transformer T3 is disposed on the substrate 2. Specifically, the output balun transformer T3 includes a winding formed of a wiring line disposed on the substrate 2. This contributes to a reduced size of the chip device 3. Alternatively, differently from the present disclosure, the output balun transformer T3 may be disposed on the die of the chip device 3.

FIG. 2A and FIG. 2B illustrate an example in which the first input balun transformer T1, the first differential amplifier A1 (the first carrier amplifier CA1 and the second carrier amplifier CA2), the second input balun transformer T2, and the second differential amplifier A2 (the first peak amplifier PA1 and the second peak amplifier PA2) are arranged in this order in the X direction. However, the arrangement of the first carrier amplifier CA1, the second carrier amplifier CA2, the first peak amplifier PA1, and the second peak amplifier PA2 on the die of the chip device 3 is not limited to the example illustrated in FIG. 2A and FIG. 2B. It is sufficient that a set of the first carrier amplifier CA1 and the first peak amplifier PA1 and a set of the second carrier amplifier CA2 and the second peak amplifier PA2 be disposed substantially symmetrically with respect to a straight line (the dot-and-dash line illustrated in FIG. 2A) passing through a midpoint a of a line segment connecting the first carrier amplifier CA1 and the second carrier amplifier CA2 and a midpoint b of a line segment connecting the first peak amplifier PA1 and the second peak amplifier PA2. Alternatively, on the die of the chip device 3, a set of the first input balun transformer T1, a ground terminal G1, and the first differential amplifier A1 arranged in the X direction and a set of the second input balun transformer T2 and the second differential amplifier A2 arranged in the X direction may be disposed so as to be arranged in the Y direction.

The chip device 3 is a heterojunction bipolar transistor (HBT) device (integrated circuit (IC)) constituted by, for example, gallium arsenide (GaAs)-based HBTs. The first carrier amplifier CA1, the second carrier amplifier CA2, the first peak amplifier PA1, and the second peak amplifier PA2 are formed on a die of the HBT device. In FIG. 2A and FIG. 2B, G1 denotes a ground terminal to which the emitters of the HBTs constituting the first carrier amplifier CA1 and the second carrier amplifier CA2 are connected. G2 denotes a ground terminal to which the emitters of the HBTs constituting the first peak amplifier PA1 and the second peak amplifier PA2 are connected. The chip device 3 is bump-bonded on the substrate 2 with, for example, a copper pillar or the like.

In the example illustrated in FIG. 2A and FIG. 2B, the substrate 2 is a multilayer substrate including a plurality of wiring layers Ly1, Ly2, Ly3, . . . , and Lyn (n is a natural number) laminated with an insulating layer interposed therebetween. Each layer of the substrate 2 is provided with a GND wiring line. The GND wiring lines of the individual layers are connected by, for example, an interstitial via hole (IVH), and are connected to the ground terminals G1 and G2 on the chip device 3 by, for example, bump bonding. Specifically, for example, as illustrated in FIG. 2A and FIG. 2B, the GND wiring lines are disposed in a region overlapping the ground terminals G1 and G2 on the chip device 3 as viewed in the Z direction. FIG. 2B also illustrates an example in which a wiring line disposed in the wiring layer Ly1 as a surface layer constitutes a winding of the output balun transformer T3 (a primary winding connected to the outputs of the first peak amplifier PA1 and the second peak amplifier PA2) as viewed in the Z direction.

In the configuration of the differential Doherty amplifier circuit 1 according to the first embodiment, the phase circuit 5 is a transmission line formed of a wiring line disposed in the substrate 2. Specifically, the phase circuit 5 includes a first line 51 having one end (a first end) connected to the output of the first carrier amplifier CA1 and the other end (a second end) connected to the output of the first peak amplifier PA1, and a second line 52 having one end (a first end) connected to the output of the second carrier amplifier CA2 and the other end (a second end) connected to the output of the second peak amplifier PA2.

In the configuration illustrated in FIG. 2A and FIG. 2B, the first line 51 and the second line 52 are disposed in the wiring layer Ly3 of the substrate 2. More specifically, the one end of the first line 51 is connected to the first carrier amplifier CA1 on the die of the chip device 3 via an IVH and a bump, and the other end of the first line 51 is connected to the first peak amplifier PA1 on the die of the chip device 3 via an IVH and a bump. The one end of the second line 52 is connected to the second carrier amplifier CA2 on the die of the chip device 3 via an IVH and a bump, and the other end of the second line 52 is connected to the second peak amplifier PA2 on the die of the chip device 3 via an IVH and a bump. With such a configuration in which the first line 51 and the second line 52 constituting the phase circuit 5 are disposed in a wiring layer of the substrate 2, the die size of the chip device 3 can be reduced.

In the configuration illustrated in FIG. 2A and FIG. 2B, the first line 51 and the second line 52 are disposed within the region (the first region) in which the chip device 3 is mounted as viewed in the Z direction. Accordingly, the area occupied by the differential Doherty amplifier circuit 1 on the substrate 2 can be reduced, and the size of the substrate 2 can be reduced.

Furthermore, in the configuration illustrated in FIG. 2A and FIG. 2B, the first line 51 and the second line 52 are disposed so as not to overlap the second input balun transformer T2 on the chip device 3 as viewed in the Z direction. This makes it possible to reduce deterioration in performance due to coupling between the winding of the second input balun transformer T2 and the first and second lines 51 and 52. In FIG. 2B, when at least a part of the first input balun transformer T1 is disposed at a position sandwiched between the first line 51 and the second line 52 (for example, the second input balun transformer T2 in FIG. 2B), the first line 51 and the second line 52 may be disposed so as not to overlap the first input balun transformer T1. Alternatively, in FIG. 2B, for example, when at least a part of both the first input balun transformer T1 and the second input balun transformer T2 is disposed at a position sandwiched between the first line 51 and the second line 52, the first line 51 and the second line 52 may be disposed so as to overlap neither the first input balun transformer T1 nor the second input balun transformer T2. That is, it is sufficient that the first line 51 and the second line 52 be disposed so as not to overlap the input balun transformer disposed on the chip device 3, of the first input balun transformer T1 and the second input balun transformer T2. When both the first input balun transformer T1 and the second input balun transformer T2 are disposed on the chip device 3, the first line 51 and the second line 52 may be disposed so as to overlap neither of the input balun transformers or may be disposed so as not to overlap one of the input balun transformers. From the above, it is sufficient that the first line 51 and the second line 52 be disposed outside the region overlapping at least the first input balun transformer T1 and the second input balun transformer T2 formed on the die of the chip device 3.

First Modification

Figure 3:
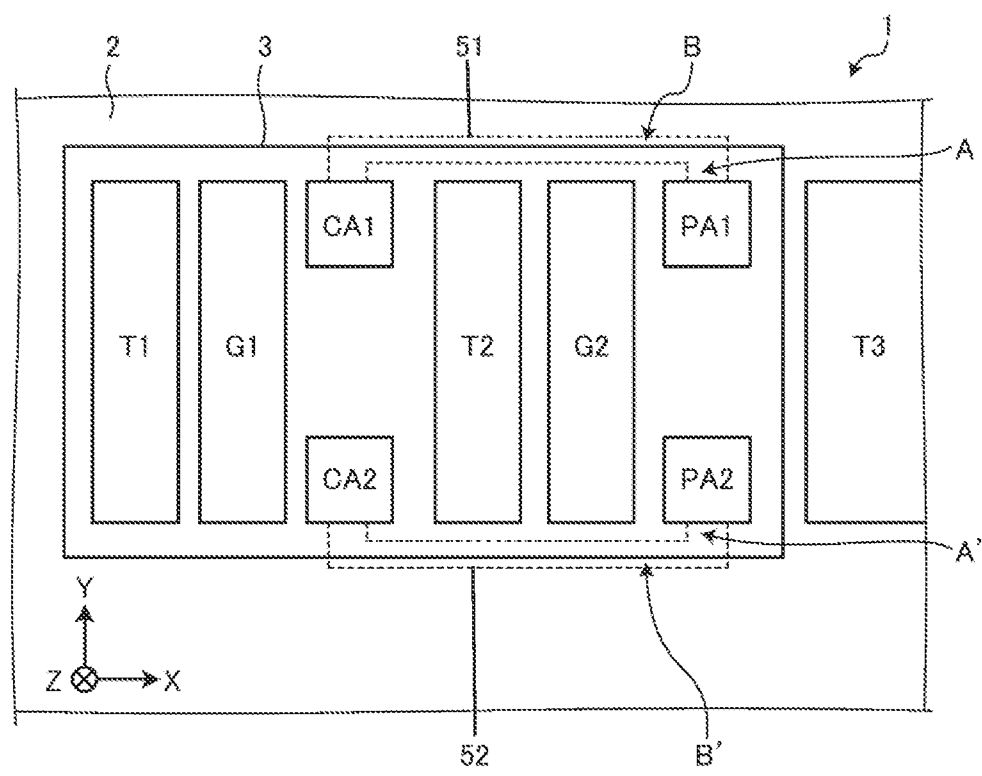
FIG. 3 is a plan view illustrating a conceptual mounting example of the differential Doherty amplifier circuit on a substrate according to a first modification of the first embodiment.

FIG. 3 is a plan view illustrating a conceptual mounting example of the differential Doherty amplifier circuit on a substrate according to a first modification of the first embodiment.

In the first modification of the first embodiment illustrated in FIG. 3, a specific example is illustrated in which the areas of the first input balun transformer T1 and the second input balun transformer T2 occupied in the die size of the chip device 3 are relatively large. Specifically, for example, when the die size of the chip device 3 is further reduced, the areas of the first input balun transformer T1 and the second input balun transformer T2 occupied in the die size of the chip device 3 may become relatively large as illustrated in FIG. 3.

In such a configuration, if the first line 51 and the second line 52 are disposed so as not to overlap the second input balun transformer T2 on the chip device 3 as viewed in the Z direction, the first line 51 and the second line 52 may extend off the region in which the chip device 3 is mounted as viewed in the Z direction. Even in such a case, both a decreased die size of the chip device 3 and a decreased size of the substrate 2 can be achieved by the configuration illustrated in FIG. 3 in which the area of a portion A of the first line 51 overlapping the region in which the chip device 3 is mounted as viewed in the Z direction is larger than the area of a portion B of the first line 51 not overlapping the region in which the chip device 3 is mounted as viewed in the Z direction, and the area of a portion A' of the second line 52 overlapping the region in which the chip device 3 is mounted as viewed in the Z direction is larger than the area of a portion B' of the second line 52 not overlapping the region in which the chip device 3 is mounted as viewed in the Z direction.

Second Modification

Figure 4A:
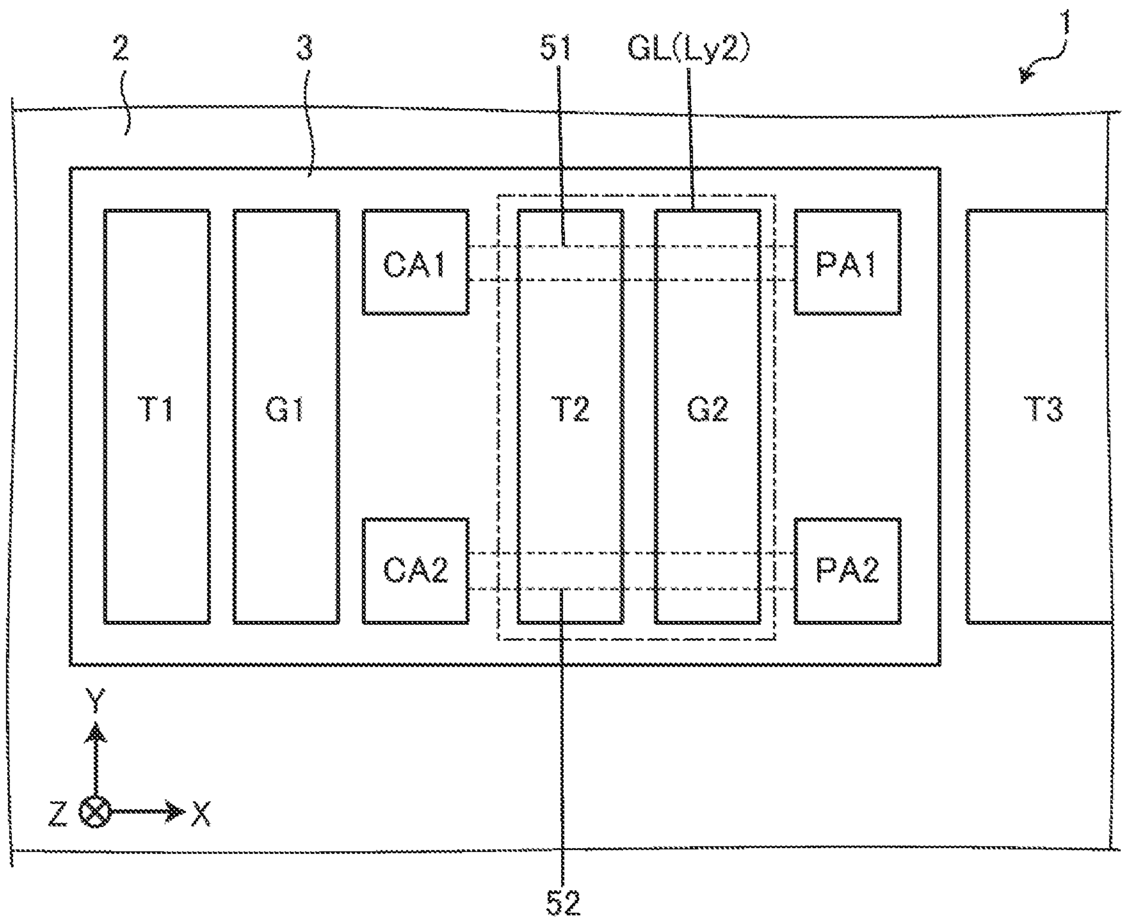
FIG. 4A is a plan view illustrating a conceptual mounting example of the differential Doherty amplifier circuit on a substrate according to a second modification of the first embodiment.
Figure 4B:
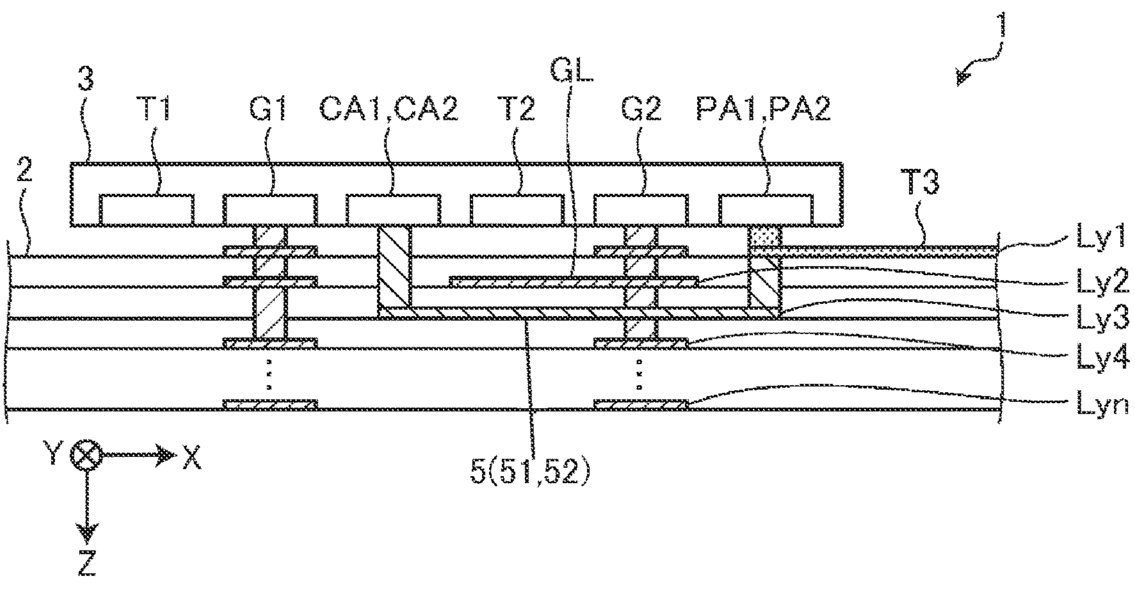
FIG. 4B is a side perspective view of the differential Doherty amplifier circuit illustrated in FIG. 4A as viewed in the Y direction.

FIG. 4A is a plan view illustrating a conceptual mounting example of the differential Doherty amplifier circuit on a substrate according to a second modification of the first embodiment. FIG. 4B is a side perspective view of the differential Doherty amplifier circuit illustrated in FIG. 4A as viewed in the Y direction.

FIG. 4A and FIG. 4B illustrate a specific example different from the first modification in a case where the areas of the first input balun transformer T1 and the second input balun transformer T2 occupied in the die size of the chip device 3 are relatively large.

In the configuration illustrated in FIG. 4A and FIG. 4B, a GND wiring line GL that covers a region overlapping at least the second input balun transformer T2 as viewed in the Z direction is disposed in the wiring layer Ly2, which is a layer above the wiring layer Ly3 of the substrate 2 in which the first line 51 and the second line 52 are disposed. In other words, the GND wiring line GL that covers the region overlapping at least the second input balun transformer T2 as viewed in the Z direction is disposed, and the first line 51 and the second line 52 are disposed in the wiring layer Ly3, which is a layer below at least the wiring layer Ly2 in which the GND wiring line GL is disposed. The GND wiring line GL is connected to the GND wiring lines of the individual layers by an IVH, and is connected to the ground terminal G2 on the chip device 3 by bump bonding. Accordingly, deterioration in performance due to the coupling between the winding of the second input balun transformer T2 and the first and second lines 51 and 52 can be reduced while the second input balun transformer T2 on the chip device 3 is disposed so as to overlap the first line 51 and the second line 52 as viewed in the Z direction, and both a decreased die size of the chip device 3 and a decreased size of the substrate 2 can be achieved.

Second Embodiment

Figure 5:
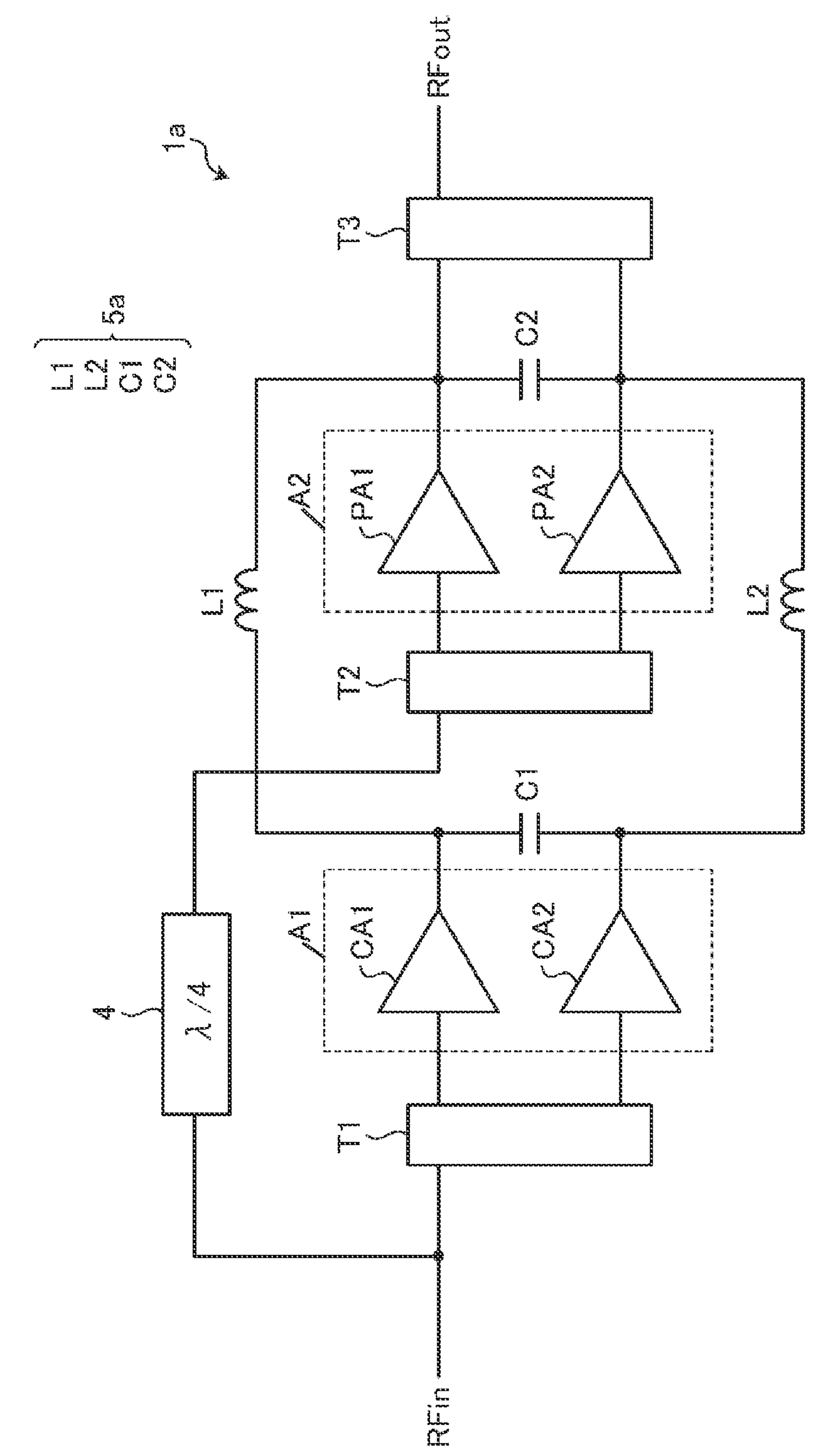
FIG. 5 is a diagram illustrating an example configuration of a differential Doherty amplifier circuit according to a second embodiment.
Figure 6A:
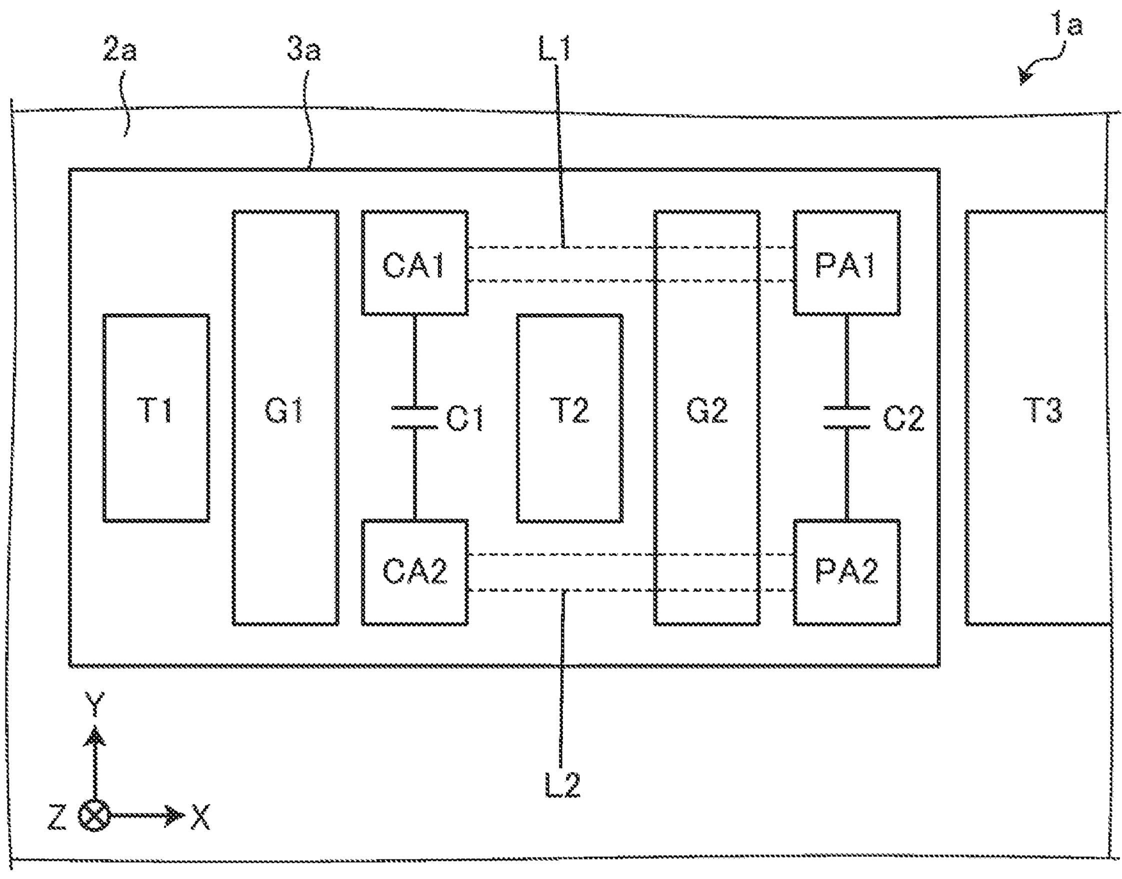
FIG. 6A is a plan view illustrating a conceptual mounting example of the differential Doherty amplifier circuit on a substrate according to the second embodiment.
Figure 6B:
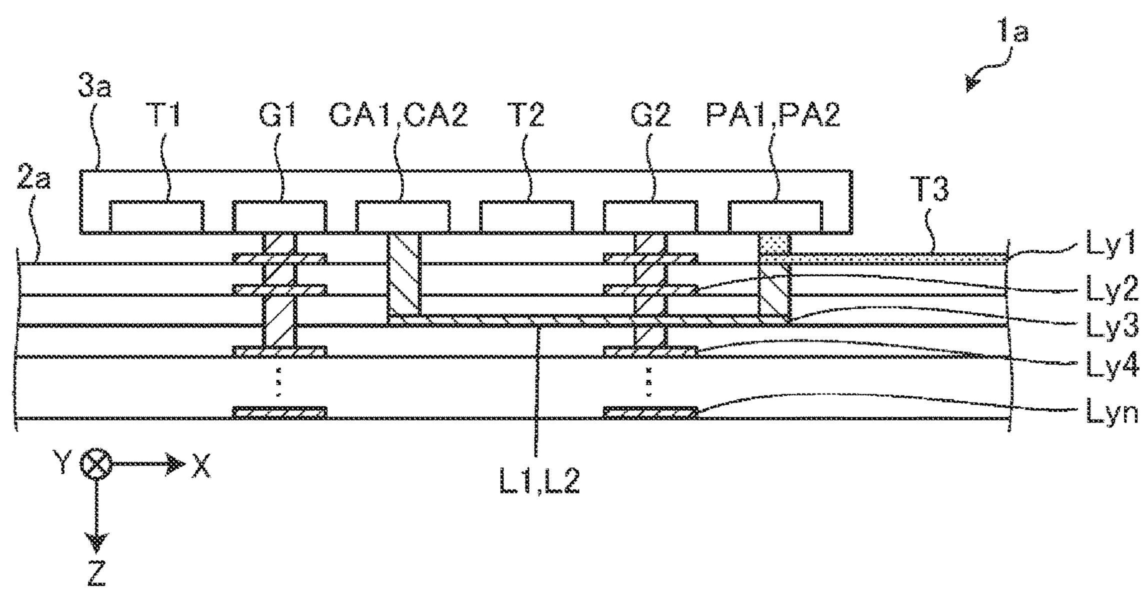
FIG. 6B is a side perspective view of the differential Doherty amplifier circuit illustrated in FIG. 6A as viewed in the Y direction.

FIG. 5 is a diagram illustrating an example configuration of a differential Doherty amplifier circuit according to the second embodiment. FIG. 6A is a plan view illustrating a conceptual mounting example of the differential Doherty amplifier circuit on a substrate according to the second embodiment. FIG. 6B is a side perspective view of the differential Doherty amplifier circuit illustrated in FIG. 6A as viewed in the Y direction.

In the configuration of a differential Doherty amplifier circuit 1*a* according to the second embodiment, a phase circuit 5*a* is a π-shaped lumped-constant circuit. Specifically, the phase circuit 5*a* includes a first inductor L1 having one end (a first end) connected to the output of the first carrier amplifier CA1 and the other end (a second end) connected to the output of the first peak amplifier PA1, a second inductor L2 having one end (a first end) connected to the output of the second carrier amplifier CA2 and the other end (a second end) connected to the output of the second peak amplifier PA2, a first capacitor C1 connected between the differential outputs of the first differential amplifier A1, and a second capacitor C2 connected between the differential outputs of the second differential amplifier A2. In the configuration according to the second embodiment, the first inductor L1 and the second inductor L2 are each formed of a wiring line disposed in a substrate 2*a*. The first capacitor C1 and the second capacitor C2 are mounted on the die of a chip device 3*a*.

In the configuration illustrated in FIG. 6A and FIG. 6B, the first inductor L1 and the second inductor L2 are disposed in the wiring layer Ly3 of the substrate 2*a*. More specifically, the one end of the first inductor L1 is connected to the first carrier amplifier CA1 on the die of the chip device 3*a* via an IVH and a bump, and the other end of the first inductor L1 is connected to the first peak amplifier PA1 on the die of the chip device 3*a* via an IVH and a bump. The one end of the second inductor L2 is connected to the second carrier amplifier CA2 on the die of the chip device 3*a* via an IVH and a bump, and the other end of the second inductor L2 is connected to the second peak amplifier PA2 on the die of the chip device 3*a* via an IVH and a bump. With such a configuration in which the first inductor L1 and the second inductor L2 constituting the phase circuit 5*a* are disposed in a wiring layer of the substrate 2*a*, the die size of the chip device 3*a* can be reduced.

In the configuration illustrated in FIG. 6A and FIG. 6B, the first inductor L1 and the second inductor L2 are disposed within the region (the first region) in which the chip device 3*a* is mounted as viewed in the Z direction. Accordingly, the area occupied by the differential Doherty amplifier circuit 1*a* on the substrate 2*a* can be reduced, and the size of the substrate 2*a* can be reduced.

Furthermore, in the configuration illustrated in FIG. 6A and FIG. 6B, the first inductor L1 and the second inductor L2 are disposed so as not to overlap the second input balun transformer T2 on the chip device 3*a* as viewed in the Z direction. This makes it possible to reduce deterioration in performance due to coupling between the winding of the second input balun transformer T2 and the first and second inductors L1 and L2. In FIG. 6B, when at least a part of the first input balun transformer T1 is disposed at a position sandwiched between the first inductor L1 and the second inductor L2 (for example, the second input balun transformer T2 in FIG. 6B), the first inductor L1 and the second inductor L2 may be disposed so as not to overlap the first input balun transformer T1. Alternatively, in FIG. 6B, for example, when at least a part of both the first input balun transformer T1 and the second input balun transformer T2 is disposed at a position sandwiched between the first inductor L1 and the second inductor L2, the first inductor L1 and the second inductor L2 may be disposed so as to overlap neither the first input balun transformer T1 nor the second input balun transformer T2. That is, it is sufficient that the first inductor L1 and the second inductor L2 be disposed so as not to overlap the input balun transformer disposed on the chip device 3*a*, of the first input balun transformer T1 and the second input balun transformer T2. When both the first input balun transformer T1 and the second input balun transformer T2 are disposed on the chip device 3*a*, the first inductor L1 and the second inductor L2 may be disposed so as to overlap neither of the input balun transformers or may be disposed so as not to overlap one of the input balun transformers. From the above, it is sufficient that the first inductor L1 and the second inductor L2 be disposed outside the region overlapping at least the first input balun transformer T1 and the second input balun transformer T2 formed on the die of the chip device 3*a*.

First Modification

Figure 7:
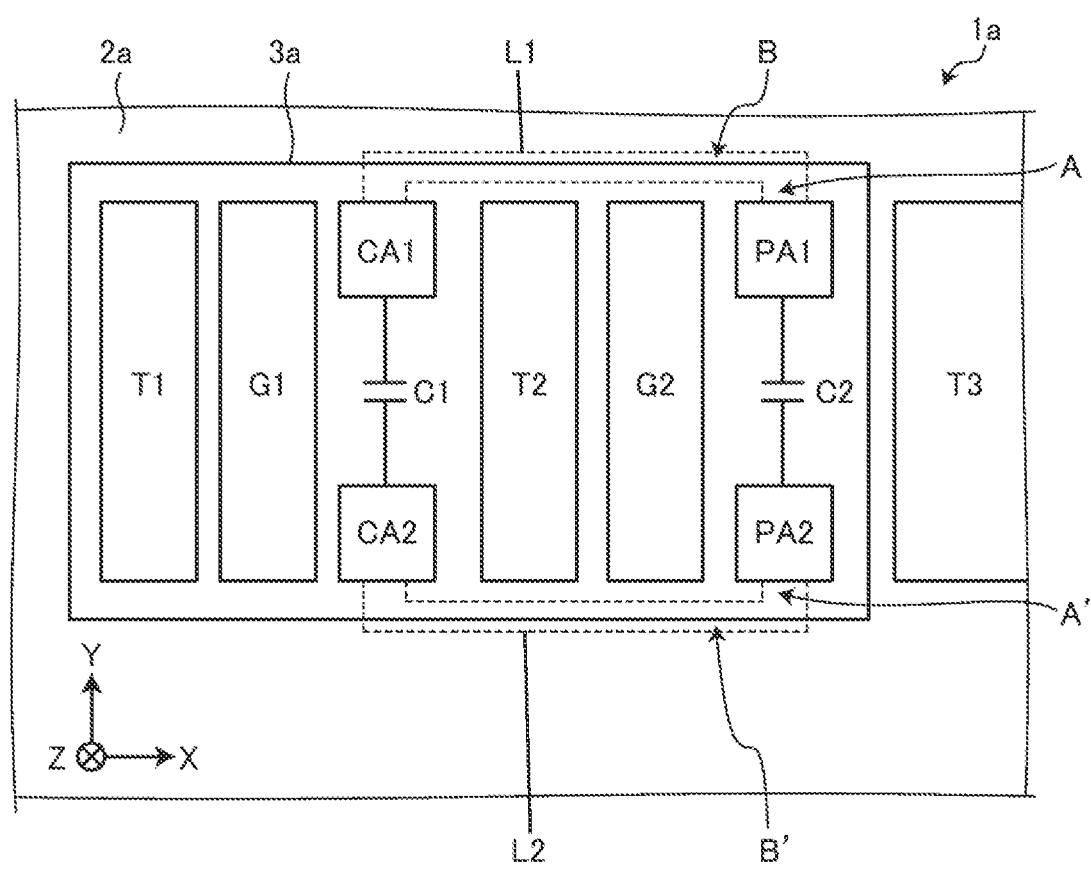
FIG. 7 is a plan view illustrating a conceptual mounting example of the differential Doherty amplifier circuit on a substrate according to a first modification of the second embodiment.

FIG. 7 is a plan view illustrating a conceptual mounting example of the differential Doherty amplifier circuit on a substrate according to a first modification of the second embodiment.

In the first modification of the second embodiment illustrated in FIG. 7, as in the first modification of the first embodiment, a specific example is illustrated in which the areas of the first input balun transformer T1 and the second input balun transformer T2 occupied in the die size of the chip device 3*a* are relatively large.

In such a configuration, if the first inductor L1 and the second inductor L2 are disposed so as not to overlap the second input balun transformer T2 on the chip device 3 as viewed in the Z direction, the first inductor L1 and the second inductor L2 may extend off the region in which the chip device 3*a* is mounted as viewed in the Z direction. In addition, for example, in a configuration in which the first inductor L1 and the second inductor L2 are constituted by surface mount devices (SMDs) and are mounted on the substrate 2*a*, the area occupied by the differential Doherty amplifier circuit 1*a* on the substrate 2*a* increases.

In the present disclosure, as described above, the first inductor L1 and the second inductor L2 are each formed of a wiring line disposed in the substrate 2*a*. Both a decreased die size of the chip device 3*a* and a decreased size of the substrate 2*a* can be achieved by the configuration illustrated in FIG. 7 in which the area of a portion A of the first inductor L1 overlapping the region in which the chip device 3*a* is mounted as viewed in the Z direction is larger than the area of a portion B of the first inductor L1 not overlapping the region in which the chip device 3*a* is mounted as viewed in the Z direction, and the area of a portion A' of the second inductor L2 overlapping the region in which the chip device 3*a* is mounted as viewed in the Z direction is larger than the area of a portion B' of the second inductor L2 not overlapping the region in which the chip device 3*a* is mounted as viewed in the Z direction.

Second Modification

Figure 8A:
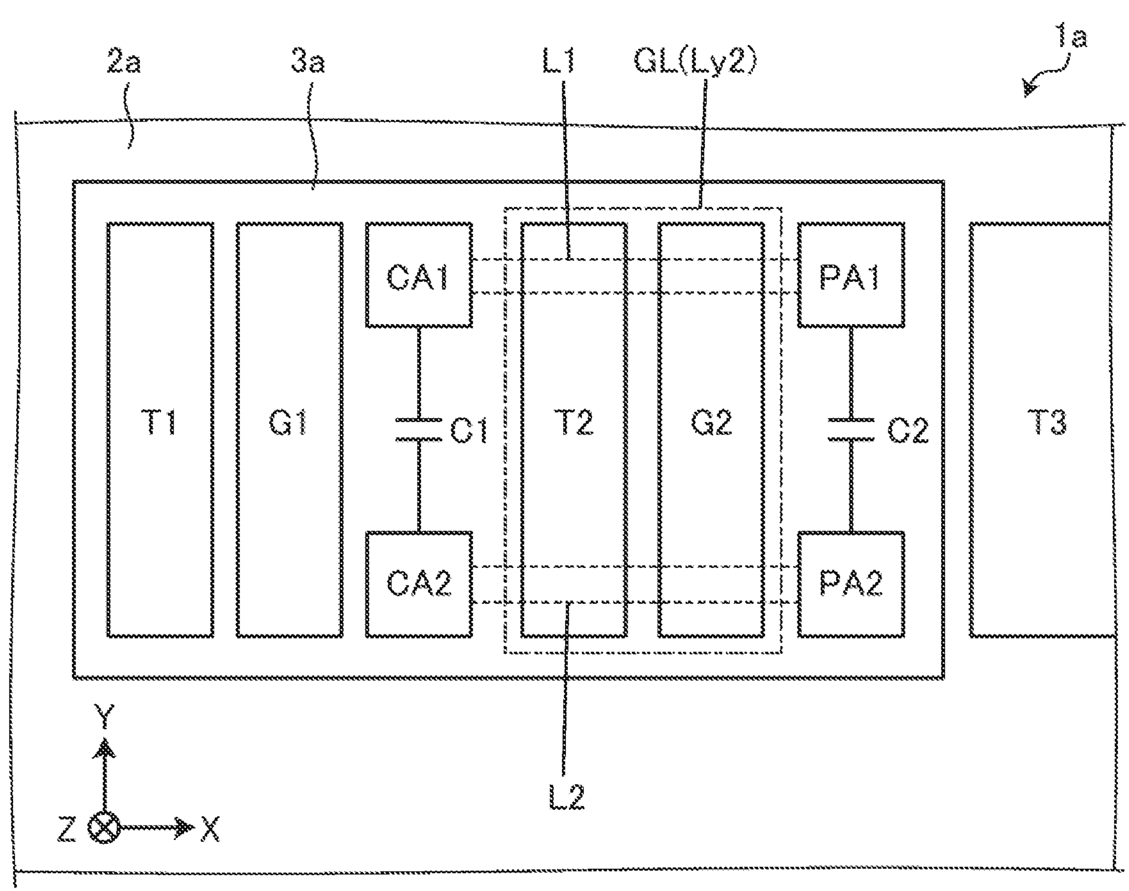
FIG. 8A is a plan view illustrating a conceptual mounting example of the differential Doherty amplifier circuit on a substrate according to a second modification of the second embodiment.
Figure 8B:
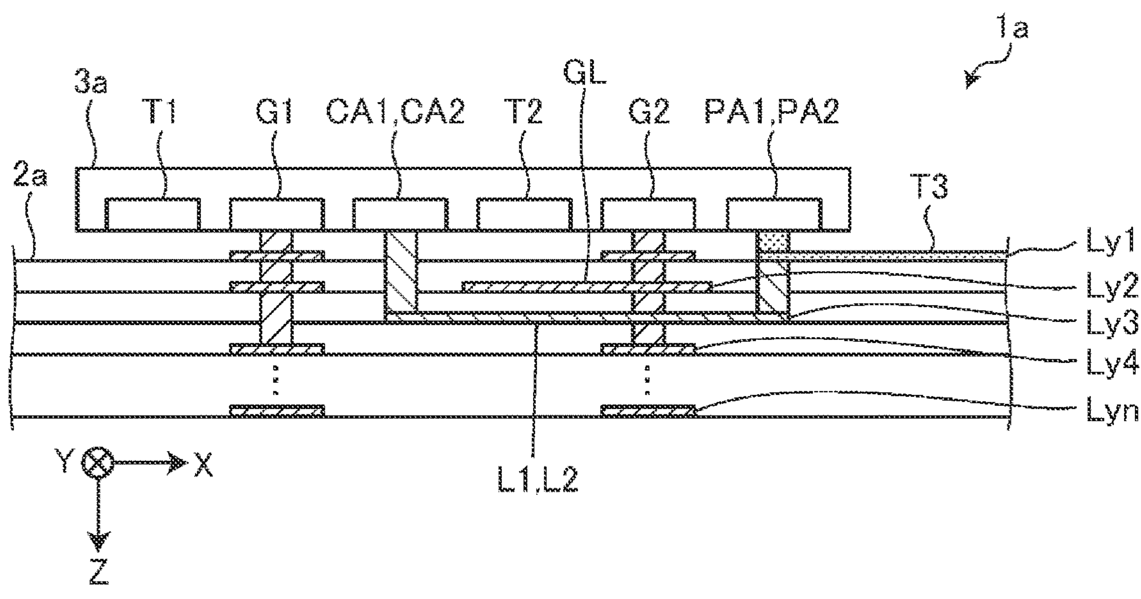
FIG. 8B is a side perspective view of the differential Doherty amplifier circuit illustrated in FIG. 8A as viewed in the Y direction.

FIG. 8A is a plan view illustrating a conceptual mounting example of the differential Doherty amplifier circuit on a substrate according to a second modification of the second embodiment. FIG. 8B is a side perspective view of the differential Doherty amplifier circuit illustrated in FIG. 8A as viewed in the Y direction.

FIG. 8A and FIG. 8B illustrate, similarly to the second modification of the first embodiment, a specific example different from the first modification in a case where the areas of the first input balun transformer T1 and the second input balun transformer T2 occupied in the die size of the chip device 3*a* are relatively large.

In the configuration illustrated in FIG. 8A and FIG. 8B, a GND wiring line GL that covers a region overlapping at least the second input balun transformer T2 as viewed in the Z direction is disposed in the wiring layer Ly2, which is a layer above the wiring layer Ly3 of the substrate 2*a* in which the first inductor L1 and the second inductor L2 are disposed. In other words, the GND wiring line GL that covers the region overlapping at least the second input balun transformer T2 as viewed in the Z direction is disposed, and the first inductor L1 and the second inductor L2 are disposed in the wiring layer Ly3, which is a layer below at least the wiring layer Ly2 in which the GND wiring line GL is disposed. Accordingly, deterioration in performance due to the coupling between the winding of the second input balun transformer T2 and the first and second inductors L1 and L2 can be reduced while the second input balun transformer T2 on the chip device 3*a* is disposed so as to overlap the first inductor L1 and the second inductor L2 as viewed in the Z direction, and both a decreased die size of the chip device 3*a* and a decreased size of the substrate 2*a* can be achieved.

In the above-described embodiments and modifications, examples in which the first input balun transformer T1 and the second input balun transformer T2 are formed on the die of the chip device 3 are illustrated, but the present disclosure is not limited thereto. For example, the first input balun transformer T1 and the second input balun transformer T2 may be disposed on the substrate 2 (2*a*), and thereby the chip device 3 (3*a*) can be further reduced in size. In this case, the area occupied by the differential Doherty power amplifier circuit 1 (1*a*) on the substrate 2 (2*a*) may increase. In the present disclosure, the configurations according to the above-described embodiments and modifications may be employed in the configuration in which at least the second input balun transformer T2 is disposed on the die of the chip device 3 (3*a*), and accordingly both a decreased die size of the chip device 3 (3*a*) and a decreased size of the substrate 2 (2*a*) can be achieved.

The above-described embodiments are intended to facilitate understanding of the present disclosure, and are not intended to be construed as limiting the present disclosure. The present disclosure can be modified or improved without necessarily departing from the gist thereof, and equivalents thereof are also included in the present disclosure.

The present disclosure may employ the following configurations as described above or instead of the above.

(1) A differential Doherty amplifier circuit according to an aspect of the present disclosure includes a first differential amplifier including a first carrier amplifier and a second carrier amplifier, a second differential amplifier including a first peak amplifier and a second peak amplifier, a first line having one end connected to an output of the first carrier amplifier and an other end connected to an output of the first peak amplifier, and a second line having one end connected to an output of the second carrier amplifier and an other end connected to an output of the second peak amplifier. At least the first differential amplifier and the second differential amplifier are formed on a die of a chip device parallel to an XY plane including an X direction and a Y direction orthogonal to the X direction. The first line and the second line are each formed of a wiring line disposed in a substrate parallel to the XY plane, the chip device being flip-chip mounted on the substrate in a Z direction orthogonal to the XY plane. The first line has a first portion overlapping a region in which the chip device is mounted as viewed in the Z direction and a second portion not overlapping the region in which the chip device is mounted as viewed in the Z direction, the first portion having a larger area than the second portion. The first line has a third portion overlapping the region in which the chip device is mounted as viewed in the Z direction and a fourth portion not overlapping the region in which the chip device is mounted as viewed in the Z direction, the third portion having a larger area than the fourth portion.

(2) In the differential Doherty amplifier circuit according to (1) described above, the differential Doherty amplifier circuit further includes a first input balun transformer configured to transform an unbalanced input signal into a differential signal and input the differential signal to the first differential amplifier, and a second input balun transformer configured to transform an unbalanced input signal into a differential signal and input the differential signal to the second differential amplifier. At least one of the first input balun transformer and the second input balun transformer is formed on the die of the chip device.

(3) In the differential Doherty amplifier circuit according to (2) described above, the first line and the second line are disposed outside a region overlapping at least the first input balun transformer and the second input balun transformer formed on the die of the chip device as viewed in the Z direction.

(4) In the differential Doherty amplifier circuit according to (2) described above, the substrate is a multilayer substrate including a plurality of wiring layers laminated with an insulating layer interposed therebetween, and is provided with a GND wiring line that covers a region overlapping at least the second input balun transformer as viewed in the Z direction; the GND wiring line is electrically connected to ground; and the first line and the second line are disposed in a layer below at least a layer in which the GND wiring line is disposed.

(5) In the differential Doherty amplifier circuit according to (1) to (4) described above, the differential Doherty amplifier circuit further includes an output balun transformer configured to transform, into an unbalanced output signal, a differential signal output from a connection point between the output of the first peak amplifier and the other end of the first line and a connection point between the output of the second peak amplifier and the other end of the second line. The output balun transformer is formed of a wiring line disposed on the substrate.

(6) A differential Doherty amplifier circuit according to an aspect of the present disclosure includes a first differential amplifier including a first carrier amplifier and a second carrier amplifier, second differential amplifier including a first peak amplifier and a second peak amplifier, a first inductor having one end connected to an output of the first carrier amplifier and an other end connected to an output of the first peak amplifier, a second inductor having one end connected to an output of the second carrier amplifier and an other end connected to an output of the second peak amplifier, a first capacitor connected between differential outputs of the first differential amplifier, and a second capacitor connected between differential outputs of the second differential amplifier. At least the first differential amplifier and the second differential amplifier are formed on a die of a chip device parallel to an XY plane including an X direction and a Y direction orthogonal to the X direction. The first inductor and the second inductor are each formed of a wiring line disposed in a substrate parallel to the XY plane, the chip device being flip-chip mounted on the substrate in a Z direction orthogonal to the XY plane. The first capacitor and the second capacitor are formed on the die of the chip device. The first inductor has a first portion overlapping a region in which the chip device is mounted as viewed in the Z direction and a second portion not overlapping the region in which the chip device is mounted as viewed in the Z direction, the first portion having a larger area than the second portion. The second inductor has a third portion overlapping the region in which the chip device is mounted as viewed in the Z direction and a fourth portion not overlapping the region in which the chip device is mounted as viewed in the Z direction, the third portion having a larger area than the fourth portion.

(7) In the differential Doherty amplifier circuit according to (6) described above, the differential Doherty amplifier circuit further includes a first input balun transformer configured to transform an unbalanced input signal into a differential signal and input the differential signal to the first differential amplifier, and a second input balun transformer configured to transform an unbalanced input signal into a differential signal and input the differential signal to the second differential amplifier. At least one of the first input balun transformer and the second input balun transformer is formed on the die of the chip device.

(8) In the differential Doherty amplifier circuit according to (7) described above, the first inductor and the second inductor are disposed outside a region overlapping at least the first input balun transformer and the second input balun transformer formed on the die of the chip device as viewed in the Z direction.

(9) In the differential Doherty amplifier circuit according to (7) described above, the substrate is a multilayer substrate including a plurality of wiring layers laminated with an insulating layer interposed therebetween, and is provided with a GND wiring line that covers a region overlapping at least the second input balun transformer as viewed in the Z direction; the GND wiring line is electrically connected to ground; and the first inductor and the second inductor are disposed in a layer below at least a layer in which the GND wiring line is disposed.

(10) In the differential Doherty amplifier circuit according to (6) to (9) described above, the differential Doherty amplifier circuit further includes an output balun transformer configured to transform, into an unbalanced output signal, a differential signal output from a connection point between the output of the first peak amplifier and the other end of the first line and a connection point between the output of the second peak amplifier and the other end of the second line. The output balun transformer is formed of a wiring line disposed on the substrate.

According to the present disclosure, it is possible to implement a differential Doherty amplifier circuit in which a mounted device and an RF module have a decreased size.

What is claimed is:

1. A differential Doherty amplifier circuit comprising:
a first differential amplifier comprising a first carrier amplifier and a second carrier amplifier;
a second differential amplifier comprising a first peak amplifier and a second peak amplifier;
a first line having a first end connected to an output of the first carrier amplifier and a second end connected to an output of the first peak amplifier; and
a second line having a first end connected to an output of the second carrier amplifier and a second end connected to an output of the second peak amplifier,
wherein at least the first differential amplifier and the second differential amplifier are on a die of a chip device parallel to an XY plane,
wherein the first line and the second line are each a wiring line in a substrate parallel to the XY plane, the chip device being flip-chip mounted on the substrate in a Z direction, the Z direction being orthogonal to the XY plane,
wherein the first line has a first portion overlapping a first region in which the chip device is mounted as viewed in the Z direction, and a second portion not overlapping the first region as viewed in the Z direction, the first portion having a larger area than the second portion, and
wherein the first line has a third portion overlapping the first region as viewed in the Z direction, and a fourth portion not overlapping the region as viewed in the Z direction, the third portion having a larger area than the fourth portion.

2. The differential Doherty amplifier circuit according to claim 1, further comprising:
a first input balun transformer configured to transform an unbalanced input signal into a differential signal, and to input the differential signal to the first differential amplifier; and
a second input balun transformer configured to transform an unbalanced input signal into a differential signal, and to input the differential signal to the second differential amplifier,
wherein the first input balun transformer or the second input balun transformer is on the die of the chip device.

3. The differential Doherty amplifier circuit according to claim 2, wherein the first line and the second line are outside a second region overlapping at least the first input balun transformer and the second input balun transformer as viewed in the Z direction.

4. The differential Doherty amplifier circuit according to claim 2,
wherein the substrate is a multilayer substrate comprising a plurality of wiring layers laminated with an insulating layer interposed therebetween, and a GND wiring line that covers a third region overlapping at least the second input balun transformer as viewed in the Z direction,
wherein the GND wiring line is electrically connected to ground, and
wherein the first line and the second line are in a layer below at least a layer in which the GND wiring line is disposed.

5. The differential Doherty amplifier circuit according to claim 1, further comprising:
an output balun transformer configured to transform a differential signal into an unbalanced output signal, the differential signal being output from a connection point between the output of the first peak amplifier and the second end of the first line and a connection point between the output of the second peak amplifier and the second end of the second line,
wherein the output balun transformer is a wiring line disposed on the substrate.

6. A differential Doherty amplifier circuit comprising:
a first differential amplifier comprising a first carrier amplifier and a second carrier amplifier;
a second differential amplifier comprising a first peak amplifier and a second peak amplifier;
a first inductor having a first end connected to an output of the first carrier amplifier and a second end connected to an output of the first peak amplifier;
a second inductor having a first end connected to an output of the second carrier amplifier and a second end connected to an output of the second peak amplifier;
a first capacitor connected between differential outputs of the first differential amplifier; and
a second capacitor connected between differential outputs of the second differential amplifier,
wherein the first differential amplifier and the second differential amplifier are on a die of a chip device parallel to an XY plane,
wherein the first inductor and the second inductor are each a wiring line in a substrate parallel to the XY plane, the chip device being flip-chip mounted on the substrate in a Z direction, the Z direction being orthogonal to the XY plane,
wherein the first capacitor and the second capacitor are on the die of the chip device,
wherein the first inductor has a first portion overlapping a first region in which the chip device is mounted as viewed in the Z direction, and a second portion not overlapping the first region as viewed in the Z direction, the first portion having a larger area than the second portion, and
the second inductor has a third portion overlapping the first region as viewed in the Z direction, and a fourth portion not overlapping the first region as viewed in the Z direction, the third portion having a larger area than the fourth portion.

7. The differential Doherty amplifier circuit according to claim 6, further comprising:
a first input balun transformer configured to transform an unbalanced input signal into a differential signal, and to input the differential signal to the first differential amplifier; and
a second input balun transformer configured to transform an unbalanced input signal into a differential signal, and to input the differential signal to the second differential amplifier,
wherein the first input balun transformer or the second input balun transformer is on the die of the chip device.

8. The differential Doherty amplifier circuit according to claim 7, wherein the first inductor and the second inductor are outside a second region overlapping at least the first input balun transformer and the second input balun transformer as viewed in the Z direction.

9. The differential Doherty amplifier circuit according to claim 7, wherein the substrate is a multilayer substrate comprising a plurality of wiring layers laminated with an insulating layer interposed therebetween, and a GND wiring line that covers a third region overlapping at least the second input balun transformer as viewed in the Z direction, wherein the GND wiring line is electrically connected to ground, and wherein the first inductor and the second inductor are in a layer below at least a layer in which the GND wiring line is disposed.

10. The differential Doherty amplifier circuit according to claim 6, further comprising:

an output balun transformer configured to transform a differential signal into an unbalanced output signal, the differential signal being output from a connection point between the output of the first peak amplifier and the second end of the first inductor and a connection point between the output of the second peak amplifier and the second end of the second inductor, wherein the output balun transformer is a wiring line on the substrate.

* * * * *